(12) United States Patent
Nguyen et al.

(10) Patent No.: US 6,717,806 B2
(45) Date of Patent: Apr. 6, 2004

(54) COMPONENT ALIGNMENT AND RETENTION MECHANISM

(75) Inventors: Minh H. Nguyen, Katy, TX (US); Paul E. Westphall, Cypress, TX (US); Robert J. Hastings, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/178,990

(22) Filed: Jun. 25, 2002

(65) Prior Publication Data

US 2003/0235034 A1 Dec. 25, 2003

(51) Int. Cl.⁷ ................................................ G06F 1/16
(52) U.S. Cl. .................... 361/687; 361/704; 361/709; 439/160
(58) Field of Search .............................. 361/686, 687, 361/701–710, 690, 715–719, 722, 725, 728, 731–732, 734, 752–754, 796–802, 814–818; 174/16.1, 52.1, 16.3, 57; 165/80.2, 80.3, 185, 80.4, 165; 257/706–727; 439/160, 571, 377, 327, 928.1, 68, 70, 654; 324/537, 755

(56) References Cited

U.S. PATENT DOCUMENTS

| | | | | |
|---|---|---|---|---|
| 5,107,400 A | * | 4/1992 | Kobayashi | 361/685 |
| 5,572,402 A | * | 11/1996 | Jeong | 361/685 |
| 5,784,252 A | * | 7/1998 | Villa et al. | 361/683 |
| 5,906,497 A | * | 5/1999 | Pham et al. | 439/160 |
| 6,075,702 A | * | 6/2000 | Gardner et al. | 361/704 |
| 6,151,217 A | * | 11/2000 | Thomsen | 361/709 |
| 6,356,438 B1 | * | 3/2002 | Leman et al. | 361/683 |
| 6,396,698 B1 | * | 5/2002 | Holcombe | 361/704 |

* cited by examiner

Primary Examiner—Michael Datskovsky (57) ABSTRACT

An alignment and retention mechanism comprises a hinged upper subassembly rotatably mated with a fixed lower subassembly defining a receptacle into which a component (e.g., a processor and heat sink assembly) is aligned and retained in place. The alignment and retention mechanism aligns and retains the component without the use of tools and loose fasteners and includes various features that prevent an improper attempt at inserting and removing the component into the receptacle. The alignment and retention mechanism can be used in computer systems as well as other types of electrical systems.

16 Claims, 4 Drawing Sheets

COMPONENT ALIGNMENT AND RETENTION MECHANISM

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to an alignment and retention mechanism usable with respect to electronic components. More particularly, the invention relates an alignment and retention mechanism used to align and retain multiple components such as a processor/heat sink assembly and a power module.

2. Background of the Invention

As is well known, an electronic system, such as a computer, includes one or more processors, memory, power conditioning electronics and numerous other components. In some applications (e.g., enterprise environments), it is desirable for the user to be able to remove and replace some, or all, of these components. Components may need to be replaced upon their failure or the user may simply desire to upgrade the system with high performance parts.

Any time a system is designed to permit removal and insertion of a component, various issues should be addressed. For instance, it is desirable to make it as easy as possible on the user to remove and insert a component. Some components may inherently be harder to insert than others. For example, a processor may have hundreds of individual pins which insert into corresponding contacts in a socket on a system board. A non-trivial amount of force is required to cause an individual pin to be mated with its corresponding contact. With hundreds of pins, the force required to mate all of the pins can be quite large and burdensome on the user. Also, with regard to processors, the pins are typically relatively fragile and easily bent or otherwise damaged if not mated correctly with corresponding system board contacts. Additionally, many components should be mated with the computer in only one orientation. For example, a processor, which generally has a square "footprint," should be mated with the system board in only way orientation to avoid mating the processor's pins to incorrect contacts on the system board.

Another issue that should be addressed is what tools, if any, are to be required to remove and insert a component in the system. Tools are a significant issue because the user will have to ensure such tools are readily available when the time comes for maintenance. Further still, components typically are retained in a computer system using fasteners, such as screws. Once removed, screws can easily be dropped damaging other components, particularly if the system is powered up and running when the screw is accidentally dropped. As noted above, these and other issues should be addressed in producing a computer system.

BRIEF SUMMARY OF THE INVENTION

The problems noted above are solved in large part by an alignment and retention mechanism comprising a hinged upper subassembly rotatably mated with a fixed lower subassembly defining a receptacle into which a component (e.g., a processor and heat sink assembly) is aligned and retained in place. In accordance with a preferred embodiment, the alignment and retention mechanism aligns and retains the component without the use of tools and loose fasteners and includes various features that prevent an improper attempt at inserting the component into the receptacle. The alignment and retention mechanism can be used in computer systems as well as other types of electrical systems.

In accordance with one embodiment of the invention, the alignment and retention mechanism is used to hold a component in place in an electrical system and comprises a hinged upper subassembly comprising side brackets mated with an end plate and a hinge as well as a fixed lower subassembly to which the hinged upper assembly is rotatably mated. The hinged upper subassembly and the fixed lower subassembly form a component receptacle in which the component is retained. The hinged upper subassembly is rotated into an open position to permit the component to be inserted into the receptacle and then rotated to a closed position to retain the component in place. The mechanism may include two or more hinged upper assemblies thereby permitting a plurality of components to be aligned or retained in place.

An additional feature of the alignment and retention mechanism includes an end retainer bracket mated to, and extending away from, the end plate and functioning to retain another component in place adjacent the alignment and retention mechanism on a system board. The components may include a processor and heat sink assembly being retained in the receptacle and a power module being retained adjacent the mechanism. Further still, the alignment and retention mechanism preferably includes a threaded thumbscrew received into a bracket mated with the end plate and used to keep the hinged upper assembly in a closed position. Also, a plurality of alignment pins may be formed in an asymmetric arrangement on the fixed lower subassembly onto which the component is inserted so as to correctly align the component and prevent said the component from being installed in an incorrect orientation in the receptacle. The hinged upper assembly may also include one or more bias members (e.g., a curved strip of metal, spring, etc.) which provides force on the component when the hinged upper assembly is in the closed position and reduce the thermal resistance associated with the component contained within the upper subassembly. A protruding member may also be provided that protrudes laterally away from a side bracket of the hinged upper subassembly and functions to ensure that the upper assembly is not forced into a closed position when the component is not yet correctly seated in the receptacle.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF THE PREFERRED EMBODIMENTS

Figure 1:
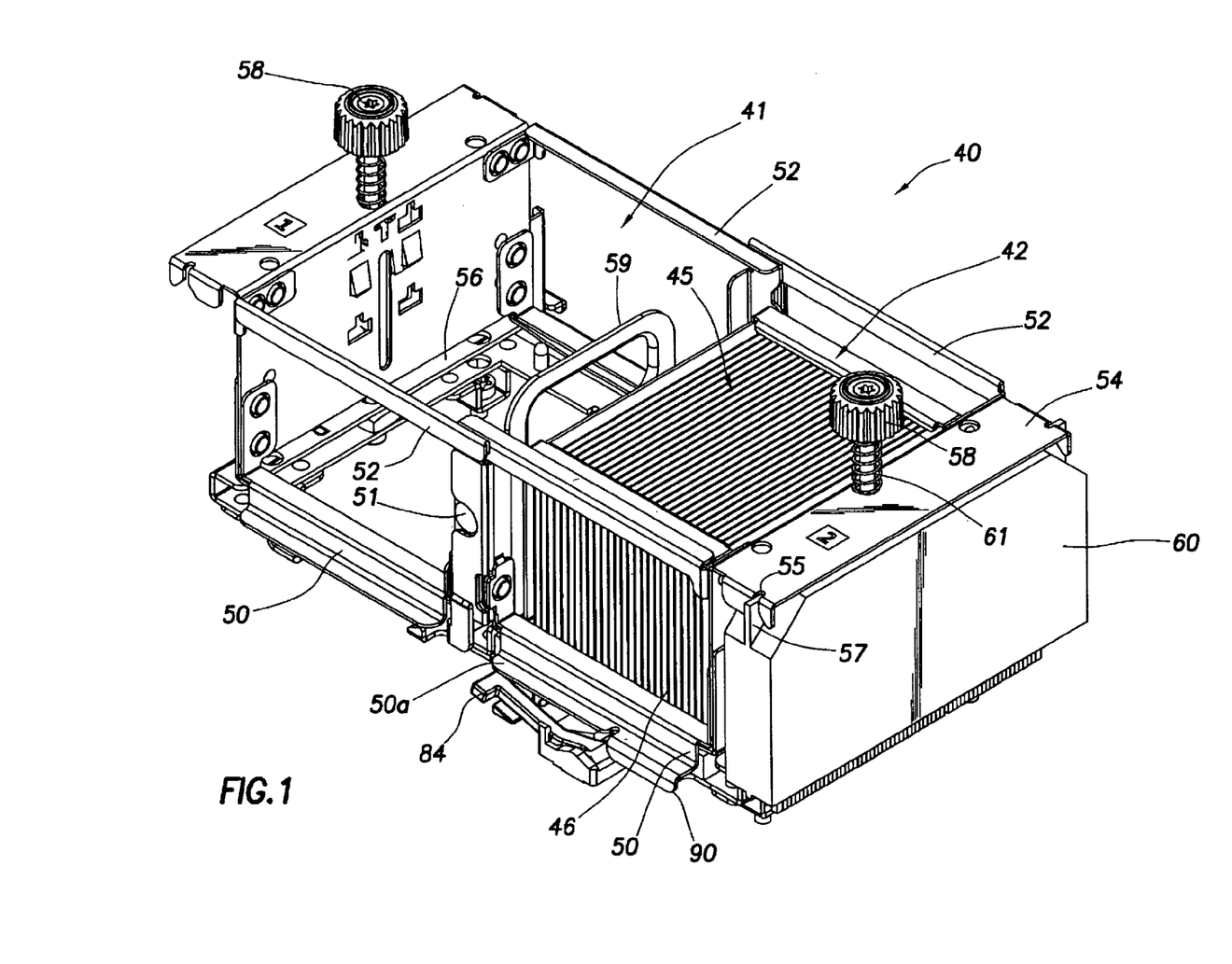
FIG. 1 shows a perspective view of a preferred embodiment of an alignment and retention mechanism.

Referring now to FIG. 1, an alignment and retention mechanism 40 is shown constructed in accordance with the preferred embodiment of the invention. The mechanism 40 is constructed so as to be usable to align and retain a pair of processor and heat sink assemblies 45 such as might be used in a computer system or other electronic system. One of ordinary skill in the art should recognize that the alignment and retention mechanism 40 can be used, however, to align and retain many other types of electrical or mechanical components. Only one such processor and heat sink assembly 45 is shown in FIG. 1 for sake of clarity. In general, the mechanism can be constructed to align and retain any desired number of components (i.e., one or more).

The alignment and retention mechanism 40 is generally composed of various side and end brackets so as to form two receptacles 41 and 42 into which the processor and heat sink assemblies 45 are inserted and reside while in use. Thus, one receptacle 41 of the alignment and retention mechanism 40 is used to hold one processor and heat sink assembly in place and the same is true with respect to the other receptacle 42. The processor and heat sink assembly 45 includes a processor (not visible in FIG. 1) residing beneath and thermally coupled to a heat sink 46.

Figure 2:
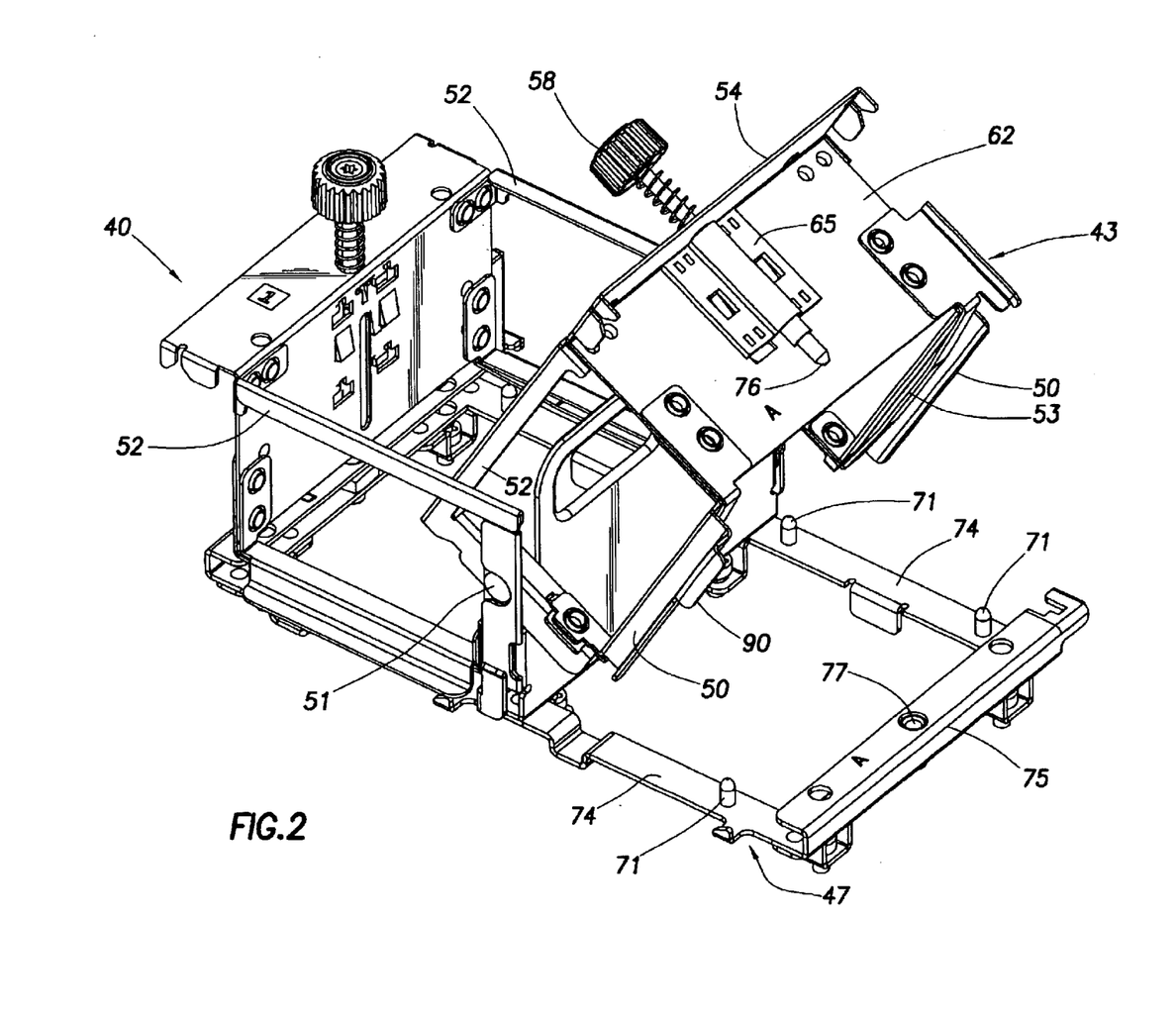
FIG. 2 illustrates how the retention mechanism hinges to permit easy removal and insertion of processor/heat sink module.

As noted above, the alignment and retention mechanism 40 includes two receptacles 41, 42 into which the processor and heat sink assemblies are retained. Referring to FIGS. 1 and 2, the various brackets defining each receptacle 41, 42 generally comprise a hinged upper subassembly 43 and fixed lower subassembly 47. The hinged upper subassemblies 43 may be formed separately. The fixed lower subassemblies 47 may either be separate subassemblies or one subassembly that spans both receptacles 41 and 42. The hinged upper assembly 43 is rotatably mated with the fixed lower subassembly 47 via any suitable type of hinge arrangement such as hinge member 51. Each pair of subassemblies 43 and 47 cooperate together so as to define a receptacle 41, 42 and retain a processor and heat sink assembly 45 therein. Each hinged upper subassembly 43 preferably includes lower side brackets 50, upper side brackets 52, and an end retainer bracket 54 residing on top of an end plate 62. Each hinged upper subassembly also includes a rotatable thumbscrew 58 to secure the processor and heat sink assembly 45 in place. A spring 61 is disposed around the thumbscrew's shaft to elevate the head of the thumbscrew when not engaged. This makes it easy on the user to grab the thumbscrew when desiring to turn it. Each fixed lower subassembly 47 includes side brackets 74 and an end bracket 75. A center wall 59 separates the two hinged upper subassemblies.

Because many processors require a separate power module to provide appropriate power to the processor, the alignment and retention mechanism 40 of the preferred embodiment also preferably retains such a power module in place for each processor and heat sink assembly 45. FIG. 1 shows a power module 60 residing at one end of the alignment and retention mechanism and having electrical connections the processor. The power module 60 shown in FIG. 1 generally comprises a circuit card that mates with the system board (not shown) in a vertical orientation as shown. This orientation causes the power module to be somewhat top heavy and thus creates the potential for the power module 60 to be damaged during shipment. The end retainer bracket 54 has been extended away from the processor and heat sink assembly 45 so as to rest on top of the power module 60 when the hinged upper assembly 43 is closed. In this position, bracket 54 applies to downward pressure on the power module 60 to retain it in place. To further assist in retaining the power module 60 in place, the retainer bracket 54 includes at least one, and preferably two, slots 55 into which corresponding fins 57 from the power module 60 insert for added lateral stability.

As best shown in FIG. 2, the upper subassembly 43 of each half of the alignment and retention mechanism 40 is hinged as shown to permit easy removal and insertion of a processor and heat sink assembly. Although not required, each upper subassembly preferably, but not necessarily, opens towards the receptacle defined by the adjacent cooperative pair subassemblies 43, 47, rather than to the outside, to minimize the amount of space in a computer system that is required to operate the hinged mechanism.

Referring still to FIG. 2, thumbscrew 58 can be seen as being held in place against the end plate 62 by a screw plate 65. The distal tip 76 of thumbscrew 58 preferably is threaded and threadingly engages a threaded hole 77 formed in bracket 75 of the lower fixed subassembly 47 to retain the hinged assembly in a locked position thereby holding the processor and heat sink assembly 45 and power module 60 securely in place.

To remove or insert a processor and heat sink assembly 45 and/or power module 60, the thumb screw 58 is loosened so as to disengage it from threaded hole 77. The hinged upper subassembly 43 of the alignment and retention mechanism 40 is hinged up and out of the way as shown in FIG. 2. Once sufficiently out of the way, the processor and heat sink assembly 45 and/or power module 60 can be removed (or inserted). The hinged upper subassembly is then swung back down and thumbscrew 58 is tightened thereby securely retaining the processor and heat sink assembly 45 and/or power module 60 in place.

The preferred embodiment of the alignment and retention mechanism 40 thus permits the component(s) being retained to be removed and replaced without the use of tools or detachable fasteners which could inadvertently fall on to the system board or elsewhere. FIG. 2 illustrates an additional advantageous feature of the alignment and retention mechanism 40. Each half of the alignment and retention mechanism 40 includes multiple alignment pins 71 preferably formed in side brackets 74 comprising the fixed lower subassembly 47. The processor and heat sink assembly 45 preferably includes mating holes (not specifically shown) formed therein into which the alignment pins inset as the assembly 45 is lowered into place in the receptacle 41, 42.

As their name implies, the alignment pins function to ensure the processor and heat sink assembly is properly oriented as it is mated with a socket on the system board. In the preferred embodiment, the side brackets 74 include three alignment pins as shown—one on one side and two on the other side—in an asymmetrical arrangement. As such, the processor and heat sink assembly 45 can be inserted into its receptacle 41, 42 in only one orientation thereby preventing a user from attempting to force the processor to be mated with the system board in an incorrect orientation.

Figure 4:
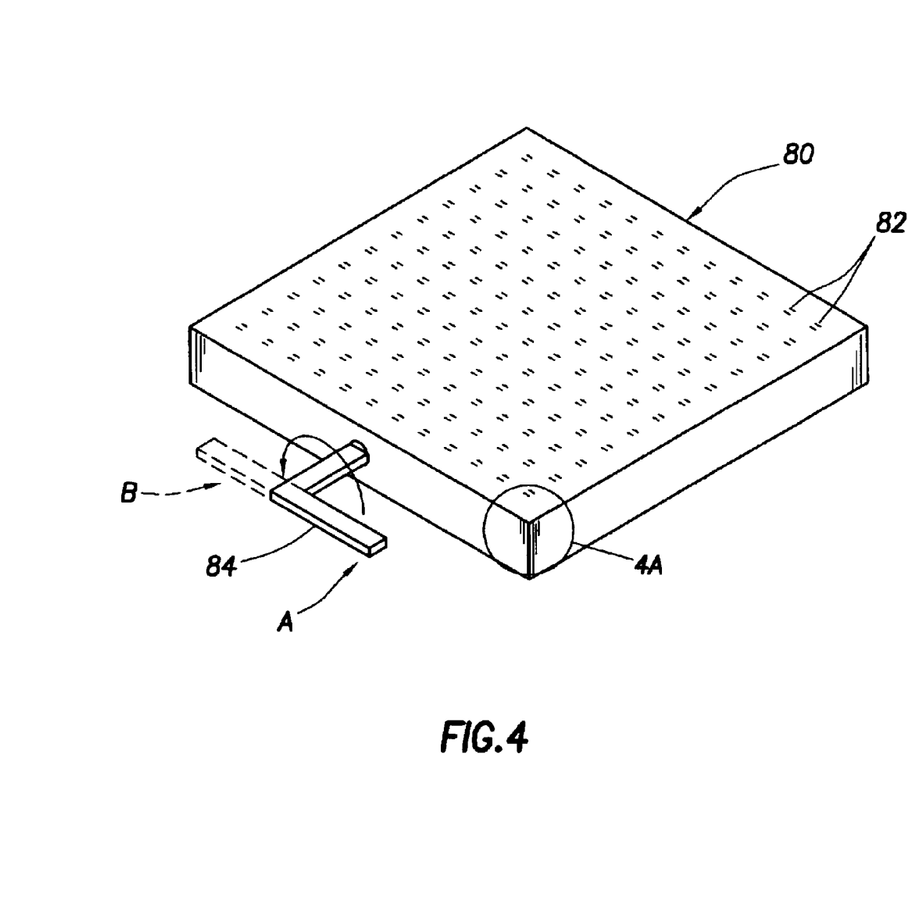
FIG. 4 shows an embodiment of an electrical socket used to receive the processor on the system board.
Figure 4A:
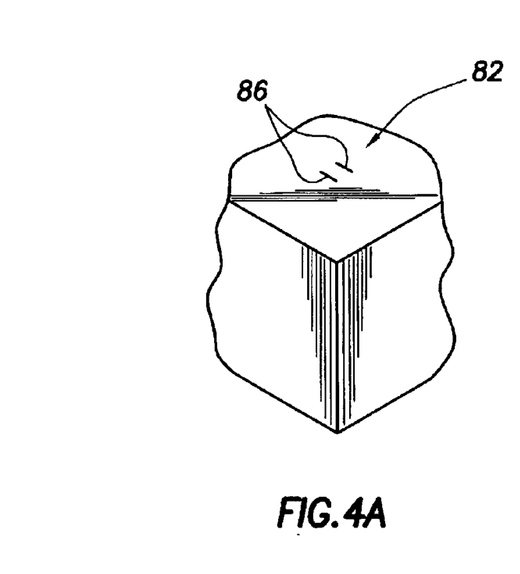

The system board includes an electrical socket into which the processor's pins mate thereby establishing electrical connections between the processor and the remaining electronics in the computer system. Referring briefly to FIG. 4, the system board socket 80 used in the preferred embodiment includes a plurality of electrical contacts 82 formed in a base portion. As shown in the expanded portion of FIG. 4, each contact 82 comprises a pair of electrical contact members 86. The pair of contact members 86 preferably are movable relative to each. The socket 80 also includes a lever arm 84 which is rotatable as shown between positions "A" and "B." Rotating the lever arm 84 causes the contact members comprising each contact 82 to separate or move closer together depending on the direction of rotation of the lever arm 84. When the contact members 86 are spaced apart at their maximum separation, the processor is easily dropped into place on the socket 80. Once the processor is in place, the lever arm 84 is rotated to the closed position, thereby forcing electrical members 86 closer together and making a sufficient electrical connection to the pins from the processor.

Figure 3:
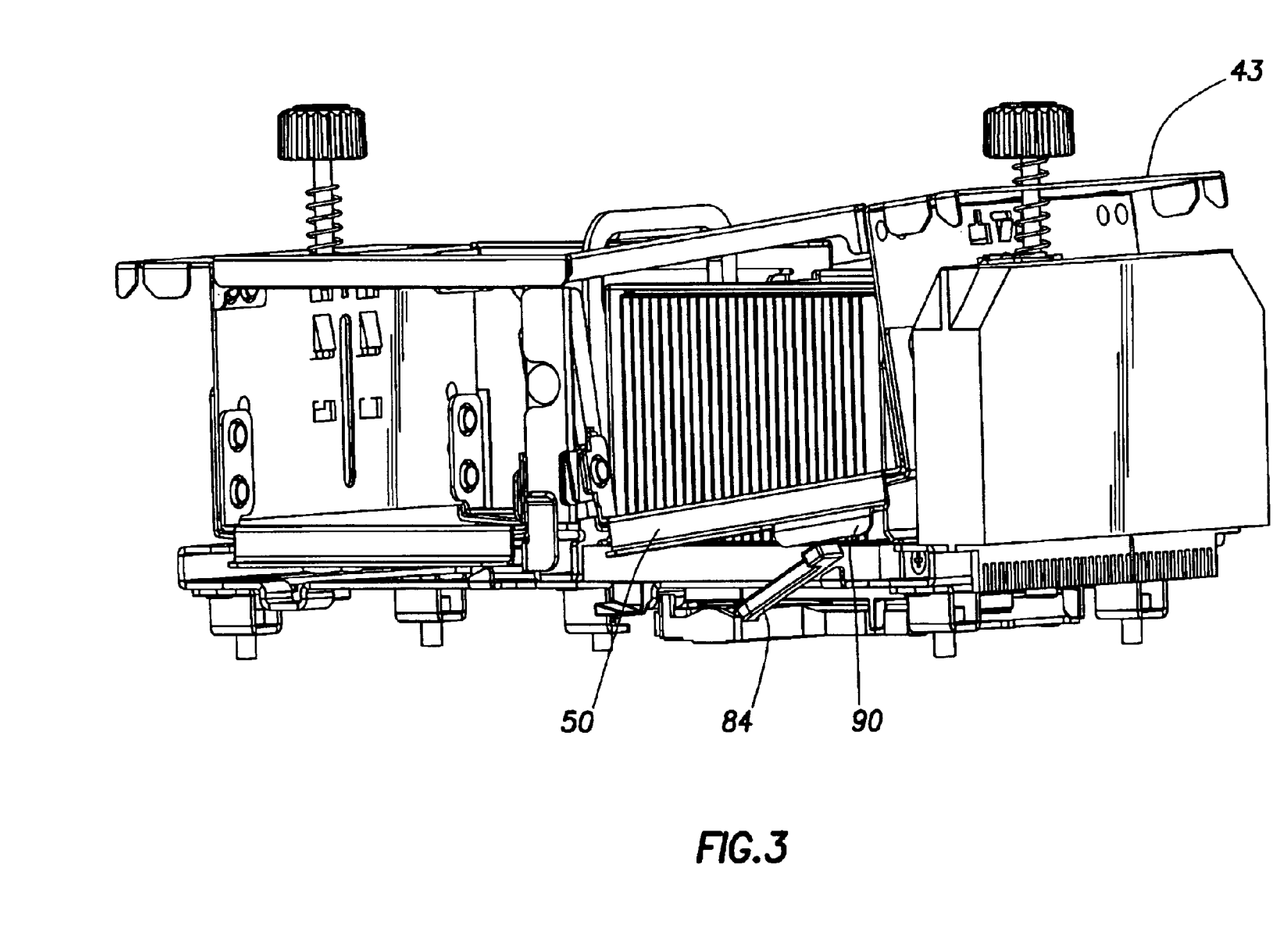
FIG. 3 illustrates an aspect of the alignment and retention mechanism that precludes a user from closing the retention mechanism without the processor/heat sink module being correctly secured in place on a system board.

The type of electrical connection mechanism shown in FIG. 4 advantageously precludes the user from having to apply a great deal of pressure to the processor and heat sink assembly to engage the processor's pins with their corresponding contacts. It is important, however, that the processor and heat sink assembly 45 not be forced down onto socket 80 by closing hinged upper assembly 43 if the lever arm 84 is in the closed position. Otherwise, the processor's pins will be bent and damaged. Referring to FIGS. 1–3, to guard against this, each hinged upper assembly 43 includes a protruding member 90 formed or otherwise attached to lower side bracket 50. This protruding member prevents the hinged upper assembly 43 from closing all of the way if the lever arm is in the open position (as it is in FIG. 3). While the lever arm is in its open position, the protruding member 90 will hit the lever arm preventing the upper assembly 43 from being seated in its closed position as shown in FIG. 1. Additionally, referring to FIG. 1, lower side bracket 50 includes an extension 50a which extends away from the processor and heat sink assembly 45 and prevents the lever arm 84 from being opened. The lever arm 84 can only be opened after the user unlocks and rotates up the upper assembly. Once this has happened, then the lever arm 84 can be flipped to its opened position thereby permitting the processor and heat sink assembly to be removed from its mating socket 80.

The preferred embodiment of the alignment and retention mechanism 40 also is designed so as to apply a predetermined amount of force downward on the processor and heat sink assembly 45 when closing the hinged upper subassembly 43. Referring to FIG. 2, a mechanical bias member 53 is attached to the lower surface of side bracket 50. As shown, the bias member comprises a curved strip of metal which functions in a spring-like manner to apply a predetermined amount of force to the processor and heat sink assembly. The bias member 53 can be any type of structure that performs this function, such as the curved metal strip shown in FIG. 2, any of a variety of spring configurations (e.g., coil spring), etc. The bias member prevents the processor and heat sink assembly 45 from being damaged as the hinged upper subassembly 43 is closed and the thumbscrew is tightened. The bias member 53 preferably provides sufficient pressure so as to minimize the thermal resistance between the processor and heat sink ensuring satisfactory thermal transfer.

Various types of materials can be used to construct the alignment and retention mechanism 40. In one embodiment, the fixed lower subassemblies 47, center wall 59 and end retainer bracket 54 are formed from 0.048 inch thick cold-rolled steel. The side brackets 50 that hold the processor and heat sink assembly 45 in place preferably are made of ½ hard stainless steel to provide sufficient hardness for the bias members 53 to hold down the processor and heat sink assembly.

The preferred construction of the alignment and retention mechanism 40 advantageously requires no tools or loose fasteners to remove or replace a component (e.g., a processor/heat sink assembly and power module) retained therein, as well as preventing a user from inserting the component in an incorrect orientation or damaging the component when attempting to insert it.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An alignment and retention mechanism used to hold a first component in place in an electronic system, comprising:
    a hinged upper subassembly comprising side brackets meted with an end plate end a hinge;
    a fixed lower subassembly to which said hinged upper assembly is rotatably mated; and
    an end retainer bracket mated to, and extending away from, said end plate and retaining a second component in place adjacent said alignment and retention mechanism;
    wherein said hinged upper subassembly and said fixed lower subassembly form a component receptacle in which the first component is retained; and
    wherein the hinged upper subassembly is rotated into an open position to permit the first component to be inserted into the receptacle and then rotated to a closed position to retain the first component in place.

2. The alignment and retention mechanism of claim 1 wherein said first component comprises a processor and heat sink assembly and said second component comprises a power module which provides power to said processor.

3. An alignment and retention mechanism used to hold a first component in place in an electronic system, comprising:
    a hinged upper subassembly comprising side brackets mated with an end plate and a hinge;
    a fixed lower subassembly to which said hinged upper assembly is rotatably mated; and
    a threaded thumbscrew received into a bracket mated with said end plate and used to keep said hinged upper assembly in a closed position; and
    wherein said hinged upper subassembly and said fixed lower subassembly form a component receptacle in which the first component is retained; and wherein the hinged upper subassembly is rotated into an open position to permit the first component to be inserted into the receptacle and then rotated to a closed position to retain the first component in place.

4. An alignment and retention mechanism used to hold a first component in place in an electronic system, comprising:
   a hinged upper subassembly comprising side brackets mated with an end plate and a hinge; and
   a fixed lower subassembly to which said hinged upper assembly is rotatably mated;
   wherein said hinged upper subassembly and said fixed lower subassembly form a component receptacle in which the first component is; retained;
   wherein the hinged upper subassembly is rotated into an open position to permit the first component to be inserted into the receptacle and then rotated to a closed position to retain the first component in place; and
   a plurality of alignment pens formed in en asymmetric arrangement on said fixed lower subassembly onto which said first component is inserted so as to correctly align said first component and prevent said first component from being installed in an incorrect orientation in said receptacle.

5. An alignment and retention mechanism used to hold a first component in place in an electronic system, comprising:
   a hinged upper subassembly comprising side brackets mated with an end plate and a hinge;
   a fixed lower subassembly to which said hinged upper assembly is rotatably mated; and
   wherein said hinged upper subassembly and said fixed lower subassembly form a component receptacle in which the first component is retained;
   wherein the hinged upper subassembly is rotated into an open position to permit the first component to be inserted into the receptacle and then rotated to a closed position to retain the first component in place; and
   a protruding member that protrudes laterally away from a side bracket of said hinged upper subassembly and contacts a lever arm used to ensure electrical contact between said first component and an electrical socket on a circuit board, said protruding member contacting said lever arm if said lever arm is in not in the position to ensure said electrical contact when said hinged upper subassembly is moved towards said closed position.

6. An alignment and retention mechanism used to hold a first component in place in an electronic system, comprising:
   a hinged upper subassembly comprising side brackets mated with an end plate and a hinge; and
   a fixed lower subassembly to which said hinged upper assembly is rotatably mated;
   wherein said hinged upper subassembly and said fixed lower subassembly form a component receptacle in which the first component is retained;
   wherein the hinged upper subassembly is rotated into an open position to permit the first component to be inserted into the receptacle and then rotated to a closed position to retain the first component in place; and
   wherein said hinged upper subassembly includes a protruding member which prevents a lever arm associated with an electrical socket to which the first component is mated from being rotated to an unlocked position while said hinged upper subassembly is in said closed position.

7. A computer system, comprising:
   a processor;
   a heat sink thermally coupled to said processor forming a processor and heat sink assembly;
   a power module coupled to said processor to provide power to said processor; and
   an alignment and retention mechanism used to hold said processor and heat sink assembly in place on a system board, said alignment and retention mechanism comprising:
     a hinged upper subassembly comprising side brackets mated with an end plate and a hinge; and
     a fixed lower subassembly to which said hinged upper assembly is rotatably mated;
     wherein said hinged upper subassembly and said fixed lower subassembly form a component receptacle in which the processor and heat sink assembly is retained;
     wherein the hinged upper subassembly is rotated into an open position to permit said processor and heat sink assembly to be inserted into the receptacle and then rotated to a closed position to retain said processor and heat sink assembly in place; and
     wherein said alignment and retention mechanism further includes an end retainer bracket mated to, and extending away from, said end plate and retaining said power module in place adjacent said alignment and retention mechanism on said system board.

8. A computer system, comprising:
   a processor;
   a heat sink thermally coupled to said processor forming a processor and heat sink assembly;
   a power module coupled to said processor to provide power to said processor; and
   an alignment and retention mechanism used to hold said processor and heat sink assembly in place on a system board, said alignment and retention mechanism comprising:
     a hinged upper subassembly comprising side brackets mated with an end plate and a hinge; and
     a fixed lower subassembly to which said hinged upper assembly is rotatably mated;
     wherein said hinged upper subassembly and said fixed lower subassembly form a component receptacle in which the processor and heat sink assembly is retained;
     wherein the hinged upper subassembly is rotated into an open position to permit said processor and heat sink assembly to be inserted into the receptacle and then rotated to a closed position to retain said processor and heat sink assembly in place; and
     wherein said alignment and retention mechanism further includes a threaded thumbscrew received into a bracket mated with said end plate and used to keep said hinged upper assembly in a closed position.

9. A computer system, comprising:
   a processor;
   a heat sink thermally coupled to said processor forming a processor and heat sink assembly;
   a power module coupled to said processor to provide power to said processor; and
   an alignment and retention mechanism used to hold said processor and heat sink assembly in place on a system board, said alignment and retention mechanism comprising:

a hinged upper subassembly comprising side brackets mated with an end plate and a hinge; and a fixed lower subassembly to which said hinged upper assembly is rotatably mated;

wherein said hinged upper subassembly and said fixed lower subassembly form a component receptacle in which the processor and heat sink assembly is retained;

wherein the hinged upper subassembly is rotated into an open position to permit said processor and heat sink assembly, to be inserted into the receptacle and then rotated to a closed position to retain said processor and heat sink assembly in place; and wherein said alignment and retention mechanism further includes a plurality of alignment pins formed in an asymmetric arrangement on said fixed lower subassembly onto which said processor and heat sink assembly is inserted so as to correctly align said processor and heat sink assembly and prevent said processor and heat sink assembly from being installed in an incorrect orientation in said receptacle.

10. A computer system, comprising:

a processor;

a heat sink thermally coupled to said processor forming a processor and heat sink assembly;

a power module coupled to said processor to provide power to said processor; and an alignment and retention mechanism used to hold said processor and heat sink assembly in place on a system board, said alignment and retention mechanism comprising:

a hinged upper subassembly comprising side brackets mated with an end plate and a hinge; and a fixed lower subassembly to which said hinged upper assembly is rotatably mated;

wherein said hinged upper subassembly and said fixed lower subassembly form a component receptacle in which the processor and heat sink assembly is retained;

wherein the hinged upper subassembly is rotated into an open position to permit said processor and heat sink assembly to be inserted into the receptacle and then rotated to a closed position to retain said processor and heat sink assembly in place; and wherein said alignment and retention mechanism further includes a protruding member that protrudes laterally away from a side bracket of said hinged upper subassembly and contacts a lever arm used to ensure electrical contact between said processor and an electrical socket on system board, said protruding member contacting said lever arm if said lever arm is in not in a position to ensure said electrical contact when said hinged upper subassembly is moved towards said closed position.

11. A computer system, comprising:

a processor;

a heat sink thermally coupled to said processor forming a processor and heat sink assembly;

a power module coupled to said processor to provide power to said processor and an alignment and retention mechanism used to hold said processor and heat sink assembly in place on a system board, said alignment and retention mechanism comprising:

a hinged upper subassembly comprising side brackets mated with an end plate and a hinge; and a fixed lower subassembly to which said hinged upper assembly is rotatably mated;

wherein said hinged upper subassembly and said fixed lower subassembly form a component receptacle in which the processor and heat sink assembly is retained;

wherein the hinged upper subassembly is rotated into an open position to permit said processor and heat sink assembly to be inserted into the receptacle and then rotated to a closed position to retain said processor and heat sink assembly in place; and wherein said hinged upper subassembly includes a protruding member which prevents a lever arm associated with an electrical socket to which the processor and heat sink assembly is mated from being rotated to an unlocked position while said hinged upper subassembly is in said closed position.

12. An alignment and retention mechanism used to hold a first component in place in an electronic system, comprising:

a hinged upper subassembly comprising side brackets mated with an end plate and a hinge; and a fixed lower subassembly to which said hinged upper assembly is rotatably mated;

wherein said hinged upper subassembly and said fixed lower subassembly form a component receptacle in which the first component is retained;

wherein said fixed lower subassembly includes a plurality of alignment pins formed in an asymmetric arrangement on said fixed lower subassembly onto which said first component is inserted so as to correctly align said first component and prevent said first component from being installed in an incorrect orientation in said receptacle; and wherein the hinged upper subassembly is rotated into an open position to permit the first component to be inserted into the receptacle and then rotated to a closed position to retain the first component in place.

13. The alignment and retention mechanism of claim 12 further including a bias member mated with at least two of said side brackets to provide force on said first component when said hinged upper assembly is in said closed position.

14. The alignment and retention mechanism of claim 12 further including a protruding member that protrudes laterally away from a side bracket of said hinged upper subassembly and contacts a lever arm used to ensure electrical contact between said first component and an electrical socket on a circuit board, said protruding member contacting said lever arm if said lever arm is in not in the position to ensure said electrical contact when said hinged upper subassembly is moved towards said closed position.

15. An alignment and retention mechanism used to hold a first component in place in an electronic system, comprising:

a hinged upper subassembly comprising side brackets mated with an end plate and a hinge; and a fixed lower subassembly to which said hinged upper assembly is rotatably mated;

wherein said hinged upper subassembly and said fixed lower subassembly from a component receptacle in which the first component is retained;

wherein said hinged upper assembly includes at least two bias members mated with at least two of said side brackets to provide force on said first component when said hinged upper assembly is in said closed position;

wherein the hinged upper subassembly is rotated into an open position to permit the first component to be inserted into the receptacle and then rotated to a closed position to retain the first component in place; and a plurality of alignment pins formed in an asymmetric arrangement on said fixed lower subassembly onto which said first component is inserted so as to correctly align said first component and prevent said first component from being installed in an incorrect orientation in said receptacle.

16. An alignment and retention mechanism used to hold a first component in place in an electronic system, comprising:

a hinged upper subassembly comprising side brackets mated with an end plate and a hinge; and a fixed lower subassembly to which said hinged upper assembly is rotatably mated;

wherein said hinged upper subassembly and said fixed lower subassembly form a component receptacle in which the first component is retained;

wherein said hinged upper assembly includes at least two bias members mated with at least two of said side brackets to provide force on said first component when said hinged upper assembly is in said closed position;

wherein the hinged upper subassembly is rotated into an open position to permit the first component to be inserted into the receptacle and then rotated to a dosed position to retain the first component in place; and a protruding member that protrudes laterally away from a side bracket of said hinged upper subassembly and contacts a lever arm used to ensure electrical contact between said first component and an electrical socket on a circuit board, said protruding member contacting said lever arm if said lever arm is in not in the position to ensure said electrical contact when said hinged upper subassembly is moved towards said closed position.

* * * * *